US012733414B2

(12) United States Patent
Frost et al.

(10) Patent No.: US 12,733,414 B2
(45) Date of Patent: Sep. 8, 2026

(54) METHOD FOR SEMICONDUCTOR PROCESSING

(71) Applicant: Tokyo Electron Limited, Tokyo (JP)

(72) Inventors: Hunter Frost, Albany, NY (US); Kandabara Tapily, Albany, NY (US); Tek Po Rinus Lee, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 403 days.

(21) Appl. No.: 18/471,854

(22) Filed: Sep. 21, 2023

(65) Prior Publication Data

US 2025/0105002 A1 Mar. 27, 2025

(51) Int. Cl.

| | |
|---|---|
| ***H10P 14/60*** | (2026.01) |
| ***C23C 16/40*** | (2006.01) |
| ***C23C 16/455*** | (2006.01) |
| ***C23C 16/56*** | (2006.01) |
| ***H01J 37/32*** | (2006.01) |

(Continued)

(52) U.S. Cl.
CPC ........ *H10P 14/6514* (2026.01); *C23C 16/402* (2013.01); *C23C 16/403* (2013.01); *C23C 16/45527* (2013.01); *C23C 16/56* (2013.01); *H10P 14/27* (2026.01); *H10P 14/432* (2026.01); *H01J 37/32091* (2013.01);
(Continued)

(58) Field of Classification Search
CPC ......... H01L 21/02315; H01L 21/02636; H01L 21/28562; H01L 21/02164; H01L 21/02178; H01L 21/02181; H01L 21/02274; H01L 21/0228; H01L 21/0234; H01L 21/32; C23C 16/402; C23C 16/403; C23C 16/45527; C23C 16/56; C23C 16/04; H01J 37/32091; H01J 37/321; H01J 37/32192; H01J 2237/332
See application file for complete search history.

(56) References Cited

U.S. PATENT DOCUMENTS

2013/0062769 A1* 3/2013 Cabral, Jr. ........ H01L 23/53233 257/E23.168
2014/0113457 A1* 4/2014 Sims ................ H01L 21/02167 438/778

(Continued)

FOREIGN PATENT DOCUMENTS

KR 20210019333 A * 2/2021 ....... C23C 16/45534
KR 102557055 B1 7/2023

OTHER PUBLICATIONS

International Searching Authority, "Notification of Transmittal of The International Search Report and the Written Opinion of The International Searching Authority, or the Declaration," International application No. PCT/US2024/037347, Date of mailing Oct. 21, 2024, 9 pages.

*Primary Examiner* — Michael G Miller
(74) *Attorney, Agent, or Firm* — Slater Matsil, LLP

(57) ABSTRACT

A method for semiconductor processing includes forming a first film over a first region of a substrate. A second region of the substrate remains substantially free of the first film. The second region is adjacent to the first region. The method further includes performing a plasma treatment over the substrate and selectively depositing a second film over the first film. The first film blocks radicals from the first region during the plasma treatment. The second region of the substrate remains substantially free of the second film.

20 Claims, 11 Drawing Sheets

(51) Int. Cl.
*H10P 14/20* (2026.01)
*H10P 14/43* (2026.01)

(52) U.S. Cl.
CPC ....... *H01J 37/321* (2013.01); *H01J 37/32192* (2013.01); *H01J 2237/332* (2013.01)

(56) References Cited

U.S. PATENT DOCUMENTS

2017/0033109 A1* 2/2017 Yamazaki .............. H10B 12/33
2020/0010953 A1* 1/2020 Haukka ................... C23C 16/04
2020/0350161 A1 11/2020 Yang et al.
2021/0301391 A1* 9/2021 Givens ................ H01L 21/0228
2022/0235461 A1 7/2022 Kim et al.
2023/0008965 A1 1/2023 Mameli et al.

* cited by examiner 200
200A
200B
302
310
210
202
204

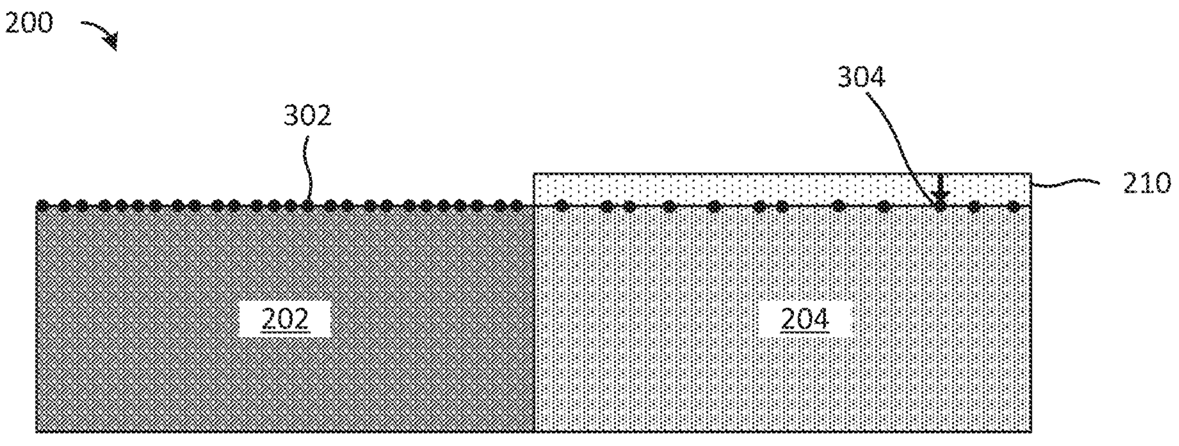
FIG. 6
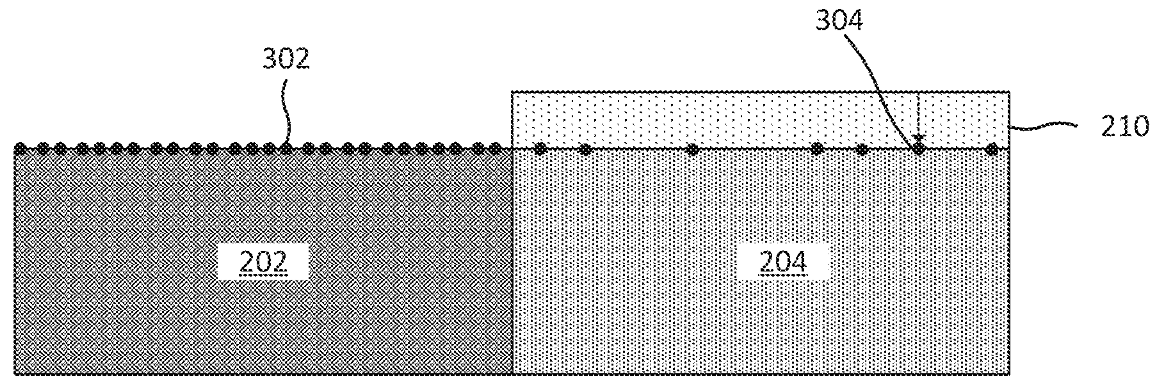
FIG. 7
200
304
302
210
202
204
FIG. 8

METHOD FOR SEMICONDUCTOR PROCESSING

TECHNICAL FIELD

The present invention relates generally to a system and method for semiconductor processing, and, in particular embodiments, to a system and method for area selective deposition.

BACKGROUND

Dimension shrinkage is one of the driving forces in the development of integrated circuit processing. By reducing the size dimensions, cost-benefit and device performance boosts can be obtained. This scalability creates inevitable complexity in process flow, especially on patterning techniques. For example, as smaller circuits such as transistors are manufactured, the critical dimension (CD) or resolution of patterned features is becoming more challenging to produce, particularly in high volume. Self-aligned patterning may replace overlay-driven patterning so that cost effective scaling can continue even after the introduction of extreme ultraviolet (EUV) lithography. Patterning options that enable reduced variability, extend scaling, and enhance CD and process control are useful in a high-volume manufacturing environment; however, it is getting extremely difficult to produce scaled devices at reasonably low cost and high yield. Selective deposition, together with selective etch, can significantly reduce the cost associated with advanced patterning. Selective deposition of thin films such as gap fill, area selective deposition of dielectrics and metals on specific substrates, and selective hard masks are key steps in patterning in highly scaled technology nodes.

Area selective deposition (ASD) techniques may be advantageous for photoresist mask smoothing, but ASD techniques may present new challenges. Selectivity to different areas may frequently be material dependent, which can limit applicability of ASD techniques. A variety of material modification techniques exist for improved selectivity, such as atomic layer deposition (ALD) and atomic layer etching (ALE) style precursor adhesion and wettability alteration.

SUMMARY

In accordance with an embodiment, a method for semiconductor processing includes: forming a first film over a first region of a substrate, a second region of the substrate remaining substantially free of the first film, the second region being adjacent to the first region; performing a plasma treatment over the substrate, the first film blocking radicals from the first region during the plasma treatment; and selectively depositing a second film over the first film, the second region of the substrate remaining substantially free of the second film.

In accordance with another embodiment, a method for an area selective deposition includes: forming a pre-coat film over a substrate, the substrate including a first layer and a second layer adjacent to the first layer, the second layer including a material different from the first layer, where the pre-coat film is formed to a greater thickness over the second layer than over the first layer; performing a surface modification on the first layer with a radical plasma treatment; and forming a film over the pre-coat film, where the film is formed to a greater thickness over the pre-coat film than over the first layer.

In accordance with yet another embodiment, a method for manufacturing a semiconductor structure includes: providing a substrate into a processing chamber, the substrate including a first layer and a second layer; forming a first film over the substrate with a first ALD process, the first ALD process being selective to the second layer over the first layer; performing a plasma process on the substrate, the plasma process modifying a top surface of the first layer, the first film shielding the second layer from radicals of the plasma process; and forming a second film over the substrate with a second ALD process, the second ALD process being selective to the first film over the modified top surface of the first layer.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6-8 illustrate cross-sectional views of intermediate steps of a semiconductor manufacturing process, in accordance with some embodiments;

Figure 1:
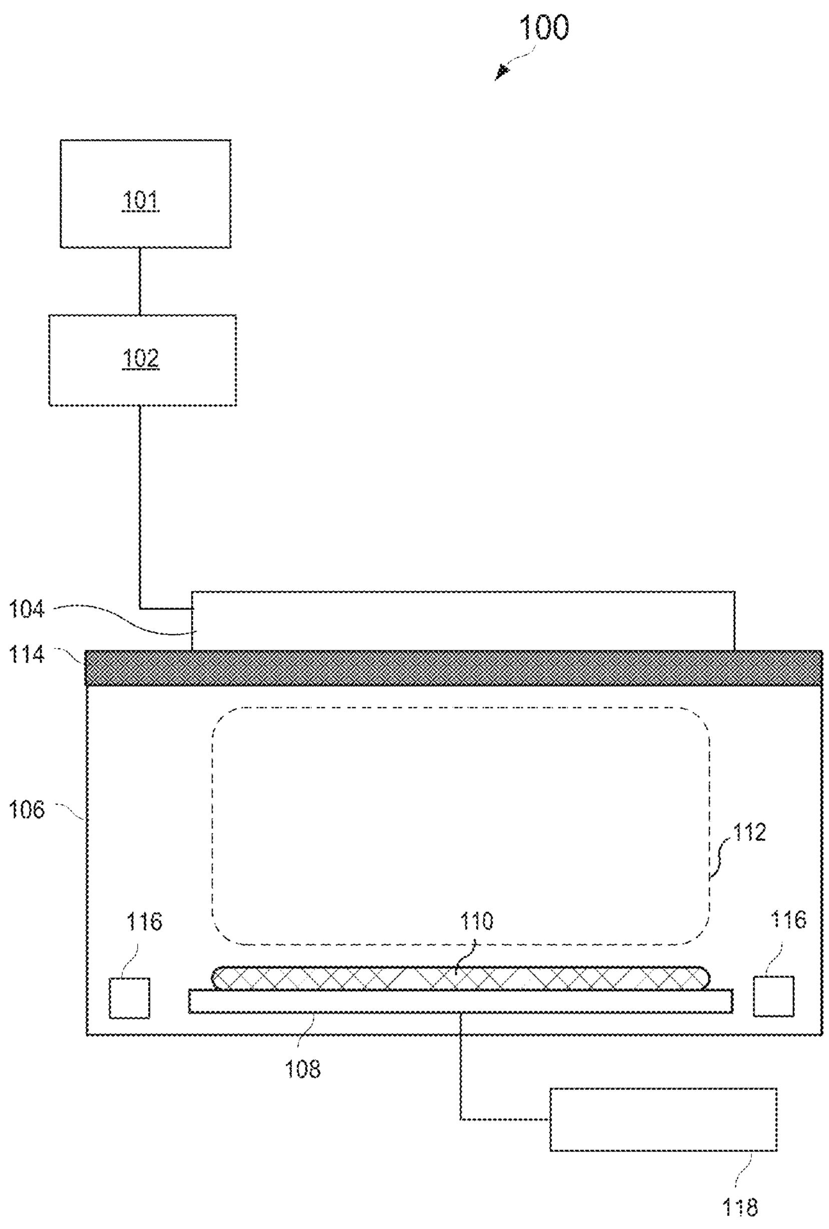
FIG. 1 illustrates a diagram of a plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of using a pre-coat process for plasma-enhanced area selective deposition (PEASD). Selective processes (such as dielectric-on-dielectric (DoD) processes) are desirable for forming, for example, fully self-aligned vias (FSAVs), self-aligned contacts (SACs), self-aligned gate contacts (SAGCs), or the like. Using a plasma-based inhibition technique such as a high-density radical plasma treatment may allow or enhance the selectivity of area selective deposition methods. Selective processes using plasma-enhanced area selective deposition may omit removal steps (e.g., removal of a self-assembled monolayer (SAM)). However, plasma treatments may result in surface damage when the plasma treatments are strong enough to meet selectivity targets. As such, it is desirable to achieve reliable selective processes for yielding high-quality films with sufficient inhibition for surfaces on which film growth is undesirable.

In embodiments of the present disclosure, the addition of an inherently selective pre-coat film may reduce plasma-induced surface damage on growth areas for an area selective deposition. The pre-coat film process takes advantage of the inherent selectivity of the surfaces to grow a thin pre-coat. The pre-coat film can extend the selectivity window of the subsequent plasma-enhanced area selective deposition while reducing the amount of the plasma treatment used. This is advantageous for improving selective deposition performance with existing process capabilities, which can improve a selectivity window while not including, for example, removal steps or organic compounds (such as SAMs) in the selective deposition process. The pre-coat process may enable extending the selectivity window and decreasing the amount of the plasma treatment by blocking radical diffusion from the plasma and thereby reducing or preventing plasma-induced surface damage on the growth area for the area selective deposition.

In various embodiments, the pre-coat comprises oxide, nitride, other dielectric films, or the like. The plasma treatment used for surface modification to inhibit forming a film on undesired surfaces may be performed with microwave plasma, capacitively coupled plasma, inductively coupled plasma, or the like. The pre-coat may block any radicalized species from the plasma treatment, such as H*, O*, N*, the like, or a combination thereof. The pre-coat and plasma treatment process may enable area selective deposition on dielectric surfaces, low-k dielectric surfaces, metal surfaces, semiconductor surfaces, or a combination thereof.

Embodiments of the disclosure are described in the context of the accompanying drawings. An embodiment of a plasma processing system will be described using FIG. 1. Embodiments of semiconductor manufacturing processes will be described using FIGS. 2-8. Experimental results for forming films will be described using FIGS. 9-12. An embodiment of a method for semiconductor processing will be described using FIG. 13. An embodiment of a method for an area selective deposition process will be described using FIG. 14. An embodiment of a method for manufacturing a semiconductor structure will be described using FIG. 15.

FIG. 1 illustrates a diagram of an embodiment plasma processing system 100, in accordance with some embodiments. As such, FIG. 1 provides one example embodiment for a plasma processing system 100 that can be used with respect to the disclosed techniques and is provided only for illustrative purposes. The plasma processing system 100 may be an inductively coupled plasma processing apparatus, transformer coupled plasma processing apparatus, capacitively coupled plasma processing apparatus, dual frequency capacitively coupled plasma processing apparatus, microwave plasma processing apparatus, radial line slot antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 100 can be used for a wide variety of operations including, but not limited to, etching, deposition, cleaning, plasma polymerization, plasma-enhanced chemical vapor deposition (PECVD), atomic layer deposition (ALD), area selective deposition (ASD), plasma-enhanced area selective deposition (PEASD), and so forth. The structure of a plasma processing system 100 is well known, and the particular structure provided herein is merely of illustrative purposes. It will be recognized that different and/or additional plasma process systems may be implemented while still taking advantage of the techniques described herein.

In the illustrated embodiment of FIG. 1, plasma processing system 100 operates using inductively coupled plasma (ICP), in accordance with some embodiments. Plasma processing system 100 includes an RF source 101, a matching circuit 102, an antenna 104, a plasma processing chamber 106, and, optionally, a dielectric plate 114, which may (or may not) be arranged as illustrated in FIG. 1. Further, plasma processing system 100 may include additional components not depicted in FIG. 1.

In various embodiments, antenna 104 is coupled to an RF source 101 through a matching circuit 102. RF source 101 includes an RF power supply, which may include a generator circuit. RF source 101 provides forward RF waves to antenna 104, which are radiated towards plasma processing chamber 106. Throughout the description, the RF source 101 may be alternatively referred to as a power supply or RF source.

RF source 101 is coupled to matching circuit 102 and matching circuit 102 is coupled to antenna 104 via power transmission lines, such as coaxial cables or the like. The RF source 101 may be employed to provide RF power to the antenna 104 as a continuous wave (CW). In various embodiments, the RF source 101 may be employed to provide pulse-modulated RF power to the antenna 104.

Typically, a matching circuit (auto or manual) coupled to the radiating antenna is used to minimize losses (i.e., reflected power) in response to changes in the load condition. The matching circuit 102 (also referred to as a matching network or an impedance matching network) is coupled between the RF source 101 and the antenna 104. As forward power propagates from the RF source 101 to the antenna 104, some reflected power may be reflected back due to impedance mismatch between the plasma processing chamber 106 and the RF source 101. The matching circuit 102 is used to reduce reflected power by transforming the impedance looking into the matching circuit 102 (in other words, the impedance of the transmission lines, plasma process chamber 106, and antenna 104) to a same impedance as the RF source 101 and any intermediate transmission lines. This increases the efficiency of supplying power to the plasma processing chamber 106.

Plasma processing chamber 106 may be, e.g., a medium frequency (MF) or high frequency (HF) plasma chamber. The plasma processing chamber 106 may be a vacuum chamber. In some embodiments, the plasma processing chamber 106 is configured to operate plasma 115 at a first resonant frequency, wherein the first resonant frequency is in a range from about 1 MHz to about 27 MHz. For example, the plasma processing chamber 106 may be configured to operate plasma 115 at 1 MHz or more, 13.56 MHz or more, 27 MHz or more, or the like. However, any suitable plasma processing chamber 106 may be used and may generate plasma with any suitable method, such as DC plasma, microwave plasma, transformer coupled plasma (TCP), capacitively coupled plasma (CCP), dual-frequency capacitively coupled plasma (CCP), the like, or a combination thereof.

In various embodiments, plasma processing chamber 106 includes a substrate holder 108 (e.g., a chuck). As illustrated, substrate 110 (e.g., a semiconductor wafer) is placed on substrate holder 108 to be processed. Optionally, plasma processing chamber 106 may include a bias power supply 118 coupled to substrate holder 108. The plasma processing chamber 106 may also include one or more pump outlets 116 to remove by-products from plasma processing chamber 106 through selective control of gas flow rates within. In various embodiments, pump outlets 116 are placed near (e.g., below/around the perimeter of) substrate holder 108 and substrate 110. In various embodiments, plasma processing chamber 106 may include additional substrate holders (not illustrated). In various embodiments, the placement of the substrate holder 108 may differ from that illustrated in FIG. 1. Thus, the quantity and position of the substrate holder 108 are non-limiting.

In various embodiments, antenna 104 radiates an electromagnetic field toward the plasma processing chamber 106. In an embodiment, antenna 104 includes arms connected to capacitive structures that generate the azimuthal symmetry. In various embodiments, the excitation frequency of the antenna 104 is in the radio frequency range (10-400 MHZ), which is not limiting, and other frequency ranges can similarly be contemplated. For example, inventive aspects disclosed herein equally apply to applications in the microwave frequency range. Various examples of designs for antennas 104 may be found in U.S. patent application Ser. No. 17/649,823, which is incorporated by reference herein in its entirety. However, any suitable antenna 104 may be used.

In various embodiments, antenna 104 is outside of plasma processing chamber 106 and is separated from plasma processing chamber 106 by the dielectric plate 114, which is typically made of a dielectric material. Dielectric plate 114 separates the low-pressure environment within plasma processing chamber 106 from the external atmosphere. It should be appreciated that antenna 104 can be placed directly adjacent to dielectric plate 114. In various embodiments, antenna 104 is separated from plasma processing chamber 106 by air. In various embodiments, the properties of the dielectric plate 114 are selected to minimize reflections of the RF wave from the plasma processing chamber 106. In other embodiments, antenna 104 is embedded within the dielectric plate 114. In various embodiments, dielectric plate 114 is in the shape of a disk. The dielectric plate 114 may be transparent or semitransparent to light, such as laser light produced by the laser generator 120.

The dielectric plate 114 includes a first outer surface and a second outer surface. The first outer surface faces the plasma processing chamber 106. The second outer surface faces the antenna 104. The second outer surface is above the first outer surface in a vertical direction.

In an embodiment, the antenna 104 couples RF power from RF source 101 to the plasma processing chamber 106 to treat substrate 110. In particular, antenna 104 radiates an electromagnetic wave in response to being fed the forward RF waves from RF source 101. The radiated electromagnetic wave penetrates from the atmospheric side (i.e., antenna 104 side) of the dielectric plate 114 into plasma processing chamber 106. The radiated electromagnetic wave generates an electromagnetic field within the plasma processing chamber 106. The generated electromagnetic field ignites and sustains plasma in a plasma generating region 112 by transferring energy to free electrons within the plasma processing chamber 106. The generated plasma can be used for a plasma process to, for example, selectively etch or deposit material on substrate 110. The plasma process may include an etch process such as a Reactive Ion Etch (RIE) process, an Atomic Layer Etch (ALE) process or the like, a deposition process such as an Area Selective Deposition (ASD) process, a Plasma-Enhanced Physical Vapor Deposition (PVD) process, a Plasma-Enhanced Chemical Vapor Deposition (CVD) process, an Atomic Layer Deposition (ALD) process, or the like.

In various embodiments, the plasma generating region 112 is immediately below the nearest portion of the dielectric plate 114 to the plasma processing chamber 106. In various embodiments, the upper most surface of the plasma generating region 112 corresponds to the plane where the outer surface of the dielectric plate 114 faces the plasma processing chamber 106.

In FIG. 1, antenna 104 is external to plasma processing chamber 106. In various embodiments, however, antenna 104 can be placed internal to the plasma processing chamber 106. In such an embodiment, the plasma generating region 112 is immediately below the nearest portion of the antenna 104 to the plasma processing chamber 106.

Figure 2:
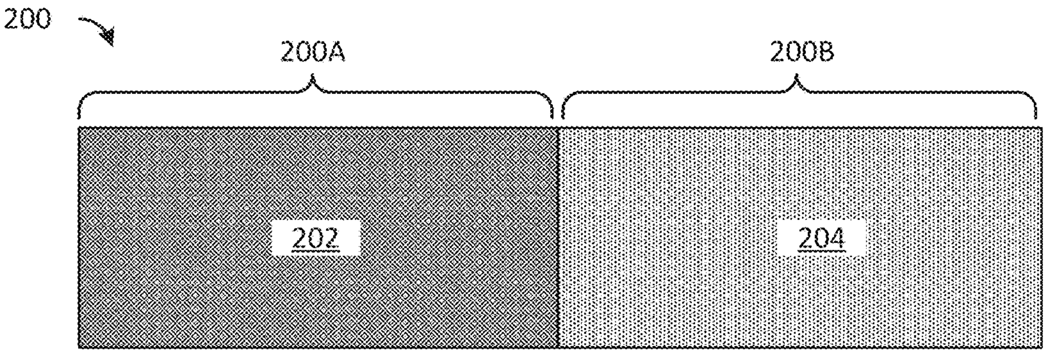
FIGS. 2-5 illustrate cross-sectional views of intermediate steps of a semiconductor manufacturing process, in accordance with some embodiments.

FIGS. 2-5 illustrate cross-sectional views of a semiconductor structure 200 (also referred to as a substrate) at intermediate stages of a semiconductor manufacturing process, in accordance with some embodiments. In FIG. 2, a semiconductor structure 200 comprises a first layer 202 in a first region 200A and a second layer 204 in a second region 200B adjacent to the first region 200A. The semiconductor structure 200 may be at any suitable stage of the semiconductor manufacturing process. For example, the semiconductor structure 200 may be at an intermediate stage of a front end of the line (FEOL) process, a middle end of the line (MEOL) process, a back end of the line (BEOL) process, or the like. The first layer 202 and the second layer 204 may be any suitable layers, such as adjacent areas of silicon and silicon oxide or adjacent areas of conductive and dielectric materials on a wafer prior to manufacturing of a transistor, adjacent metal and dielectric areas of an interconnect structure, or the like.

The first layer 202 comprises a first material and the second layer 204 comprises a second material different from the first material. In various embodiments, the first layer 202 comprises a semiconductor and the second layer 204 comprises a dielectric (e.g., silicon oxide; silicon nitride; aluminum oxide; a Group IVB transition metal oxide such as hafnium oxide, zirconium oxide, the like, or a combination thereof such as hafnium zirconium oxide; a low-k dielectric such as organosilicate glass (SiCOH); the like; or a combination thereof). For example, in some embodiments the first layer 202 comprises silicon (e.g., crystalline silicon, amorphous silicon, or a combination thereof), and the second layer 204 comprises silicon oxide (e.g., SiO, $SiO_2$, or a combination thereof). In other embodiments, the first layer 202 comprises a dielectric (e.g., silicon oxide or another dielectric described above with respect to the second layer 204) and the second layer comprises a different dielectric (e.g., silicon nitride or another dielectric described above with respect to the second layer 204).

In some embodiments, the first layer 202 comprises a first semiconductor and the second layer 204 comprises a second semiconductor different from the first semiconductor. For example, the first semiconductor may be silicon and the second semiconductor may be silicon germanium (SiGe), or the first semiconductor may be SiGe and the second semiconductor may be silicon. Embodiments may be useful for processes involving semiconductor superlattice structures, such as nanosheet transistor fabrication, or for processes involving areas where multiple types of semiconductor are exposed, such as etching with increasing selectivity between PFET and NFET epitaxial source and/or drain regions.

In various embodiments, the first layer 202 comprises a metal and the second layer 204 comprises a dielectric. For example, in some embodiments the first layer 202 comprises copper (Cu), ruthenium (Ru), tin (Sn), tungsten (W), titanium (Ti), hafnium (Hf), silver (Ag), gold (Au), cobalt (Co), nickel (Ni), molybdenum (Mb), niobium (Nb), tantalum (Ta), rhodium (Rh), iridium (Ir), palladium (Pd), indium (In), zinc (Zn), antimony (Sb), the like, or a combination thereof, and the second layer 204 comprises a dielectric such as silicon oxide or another dielectric described above with respect to the second layer 204. In other embodiments, the first layer 202 comprises a first metal (e.g., a metal described above with respect to the first layer 202) and the second layer 204 comprises a second metal (e.g., another metal described above with respect to the first layer 202) that is different from the first metal.

As such, it should be understood that the respective materials of the first layer 202 and the second layer 204 may be any combination of different materials, including dielectrics, low-k dielectrics, metals, semiconductors, or the like, and any and all such combinations are within the scope of the disclosed embodiments.

Figure 3:
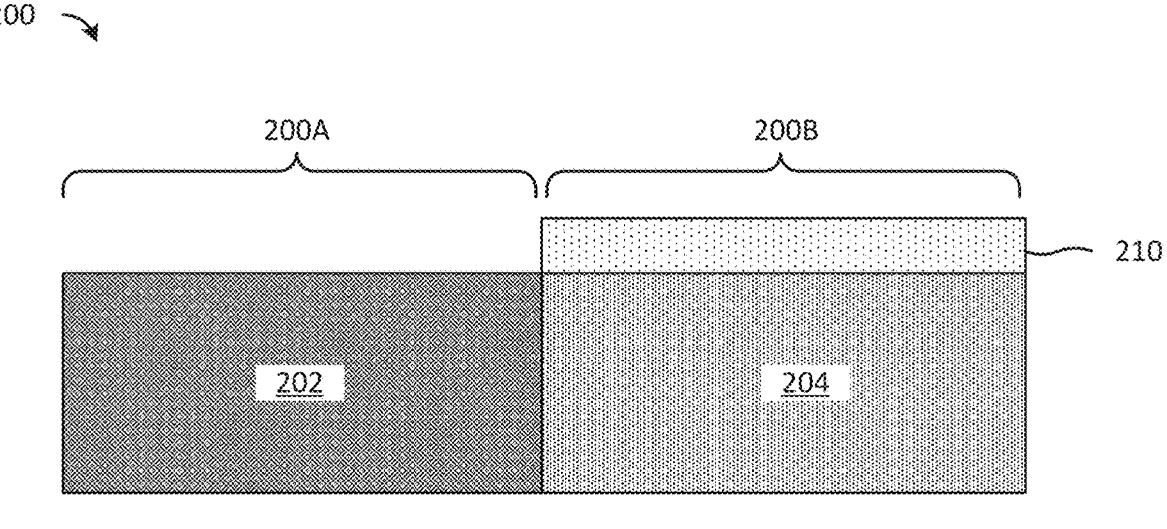

Next, in FIG. 3, the semiconductor structure 200 is provided into a processing chamber (e.g., the plasma processing chamber 106; see above, FIG. 1) and a pre-coat film 210 (also referred to as a film) is formed over the second layer 204 in the second region 200B. The pre-coat film 210 is inherently selective to the second layer 204 over the first layer 202. The pre-coat film process takes advantage of the inherent selectivity of the surfaces of the first layer 202 and the second layer 204 to grow a thin pre-coat film 210. The pre-coat film 210 will be used to protect the second layer 204 from a subsequent plasma process (see below, FIG. 4) in order to reduce plasma-induced surface damage on growth areas for a subsequent area selective deposition (see below, FIG. 5).

In various embodiments, the pre-coat film 210 comprises a dielectric such as aluminum oxide ($Al_2O_3$), hafnium oxide (HfO), zirconium oxide (ZrO), hafnium zirconium oxide (HfZrO), a low-k dielectric such as organosilicate glass (SiCOH), silicon oxide (SiO and/or $SiO_2$), silicon nitride (SiN), the like, or a combination thereof.

In some embodiments, the deposition process for the pre-coat film 210 may comprise exposing the semiconductor structure 200 to two precursors in a process chamber (e.g., the plasma processing chamber 106; see above, FIG. 1): a metal-containing precursor (e.g., an aluminum-containing precursor such as trimethylaluminium (TMA)) and an oxygen-containing precursor or oxidizer such as oxygen ($O_2$) plasma or ozone ($O_3$). The exposures to these precursors may be performed stepwise or simultaneously. In various embodiments, the deposition process may be an atomic layer deposition (ALD) or pseudo-ALD process and comprise two or more exposing steps. For example, the deposition process may be performed by first exposing the semiconductor structure 200 to the metal-containing precursor that forms an adsorbed layer on the second layer 204 and, thereafter, exposing the semiconductor structure 200 to the oxygen-containing precursor gas that reacts with the adsorbed metal-containing precursor. The exposing steps may be repeated one or more times to increase a thickness of the pre-coat film 210 on the substrate 400. However, any suitable deposition process may be used to form the pre-coat film 210.

In some embodiments, the deposition process for the pre-coat film 210 is repeated for two cycles to one hundred cycles, such as five to twenty cycles. The deposition process for the pre-coat film 210 may be chosen to be selective to the material of the second layer 204, so that a much greater thickness of the pre-coat film 210 is formed over the second layer 204 than over the first layer 202. For example, the pre-coat film 210 may be aluminum oxide and may thereby be preferentially formed in the second region 200B over a second layer 204 comprising silicon dioxide ($SiO_2$). The first region 200A having the first layer 202 comprising silicon (e.g., crystalline silicon) may have a much smaller thickness of aluminum oxide formed over the first layer 202, or the first region 200A may remain substantially free of aluminum oxide. In some embodiments, a first thickness of the pre-coat film 210 in a range of 0.1 nanometers to 10 nanometers is formed over the second layer 204.

Figures 4, 5:
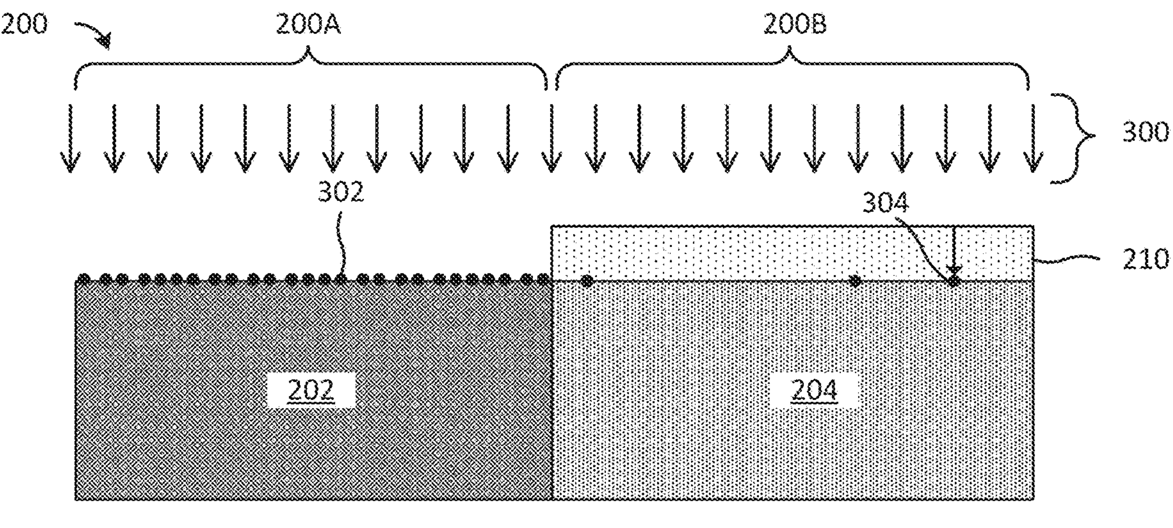

In FIG. 4, following from FIG. 3, a plasma treatment 300 (also referred to as a plasma process or a surface modification) is performed on the semiconductor structure 200. The plasma treatment 300, which may be a high-density radical plasma treatment, allows or enhances the selectivity of subsequent area selective deposition methods (see below, FIG. 5). The pre-coat film 210 shields the top surface of the second layer 204 from undesirable surface damage from the plasma treatment 300.

In various embodiments, the plasma treatment 300 is performed with radicalized species comprising H*, O*, N*, the like, or a combination thereof. The plasma treatment may be performed with any suitable method, such as DC plasma, microwave plasma, transformer coupled plasma (TCP), capacitively coupled plasma (CCP), dual-frequency capacitively coupled plasma (CCP), inductively coupled plasma (ICP), the like, or a combination thereof. In some embodiments, the plasma treatment 300 is performed at a pressure in a range of 1 mT to 10 T, using a power (as measured at the power supply) in a range of 50 W to 5000 W, and for a duration in a range of 1 second to 1800 seconds for each cycle. In various embodiments, the plasma treatment 300 is performed for one cycle or more than one cycle.

As a result of the plasma treatment 300, a plasma-induced modified surface 302 is formed on a top surface of the first layer 202. For example, radicals 304 from the plasma treatment 300 may bond with the top surface of the first layer 202. This may be advantageous for increasing selectivity of a subsequent area selective deposition (see below, FIG. 5). The pre-coat film 210 may block radicals from the plasma treatment 300 from interacting with the top surface of the second layer 204. As such, diffusion of radicals 304 through the pre-coat film 210 may be limited. This may be advantageous for reducing plasma-induced surface modification of the second layer 204, thereby improving subsequent film growth by an area selective deposition (see below, FIG. 5) and widening the selectivity window for the area selective deposition.

Next, in FIG. 5, an area selective deposition (ASD) process is performed to form a film 310 over the pre-coat film 210 in the second region 200B. The selectivity of the ASD process may be enhanced by the previous surface modification applied to the first layer 202 by the plasma treatment 300 (see above, FIG. 4) and by the reduction in surface modification to the second layer 204 resulting from the pre-coat film 210 blocking radicals of the plasma treatment 300. Due to the selectivity of the ASD process, the film 310 may be formed to a much greater thickness over the pre-coat film 210 in the second region 200B than over the first layer 202 in the first region 200A. For example, in various embodiments the first region 200A remains substantially free of the film 310. In some embodiments, a first thickness of the film 310 in a range of 0.1 nanometers to 10 nanometers is formed over the pre-coat film 210.

In various embodiments, the film 310 is formed using similar materials and methods as the pre-coat film 210 as described above with respect to FIG. 3, and the details are not repeated herein. However, the film 310 may be formed using any suitable materials and methods. In some embodiments, the film 310 comprises a same material as the pre-coat film 210. For example, the pre-coat film 210 and the film 310 may both comprise or consist essentially of aluminum oxide ($Al_2O_3$) or another material as described above for the pre-coat film 210 with respect to FIG. 3. In other embodiments, the film 310 and the pre-coat film 210 comprise or consist essentially of different materials.

In some embodiments, the steps of FIGS. 3-5 are performed in situ in a same processing chamber, such as the plasma processing chamber 106 (see above, FIG. 1). However, each of the steps of FIGS. 3-5 may also be performed in two or more different processing chambers.

FIGS. 6-8 illustrate cross-sectional views of the semiconductor structure 200 having pre-coat films 210 of different thicknesses and the resulting surface modification by radicals 304 after a plasma treatment 300, in accordance with some embodiments. FIG. 6 illustrates a pre-coat film 210 with a first thickness and a first number of radicals 304 from the plasma treatment 300 that have diffused through the pre-coat film 210 to bond with a top surface of the second layer 204. FIG. 7 illustrates a pre-coat film 210 with a second thickness greater than the first thickness and a second number of radicals 304 from the plasma treatment 300 smaller than the first number. The radicals in FIG. 7 have diffused through the pre-coat film 210 to bond with a top surface of the second layer 204 less than in FIG. 6. FIG. 8 illustrates a pre-coat film 210 with a third thickness greater than the first thickness and a third number of radicals 304 from the plasma treatment 300 smaller than the second number. The radicals in FIG. 8 have diffused through the pre-coat film 210 to bond with a top surface of the second layer 204 less than in FIG. 7. As illustrated by FIGS. 6-8, increasing the thickness of the pre-coat film 210 may reduce interactions of radicals from the plasma treatment 300 with top surfaces of the second layer 204. This may be advantageous for yielding better quality film 310 or less quality degradation of the film 310 for a subsequent ASD process to produce the film 310.

Figure 9:
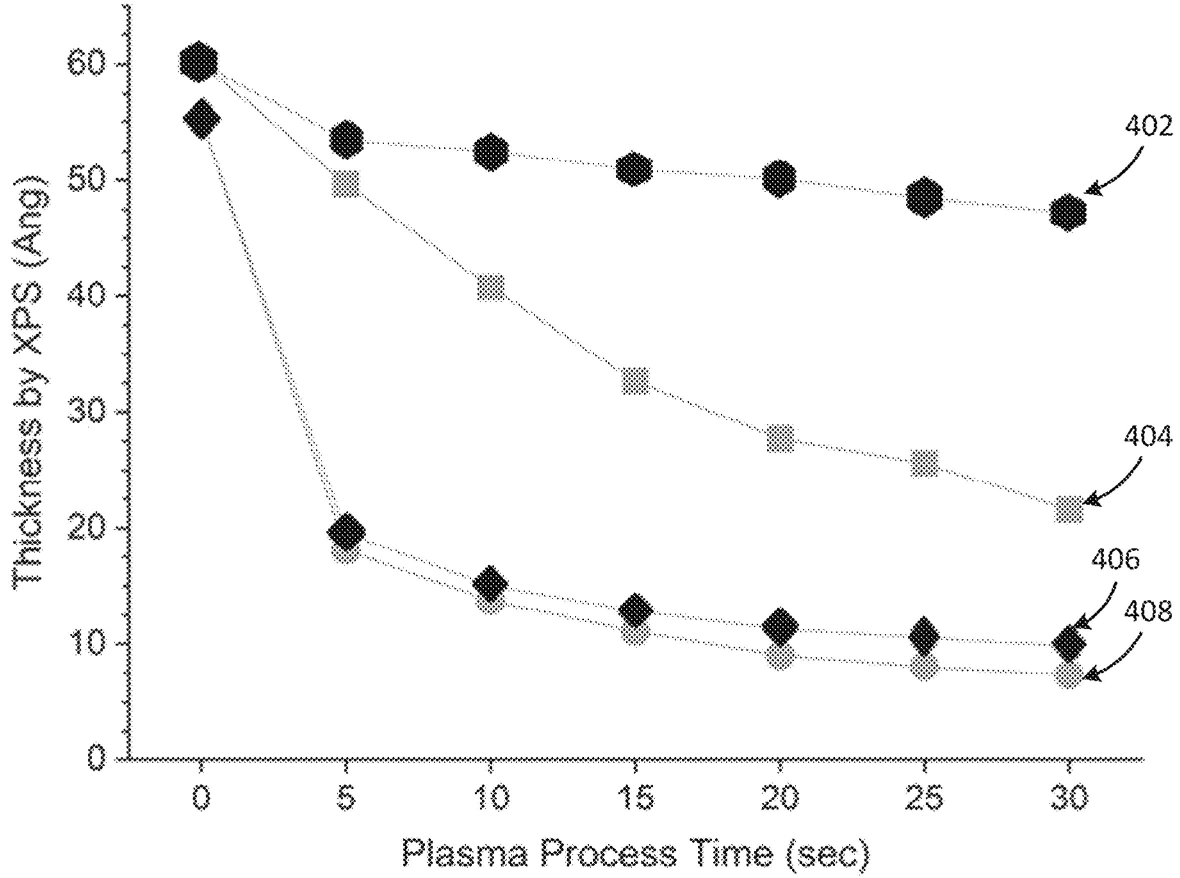
FIGS. 9-12 illustrate graphs of experimental results for forming films, in accordance with some embodiments.

FIG. 9 illustrates a graph of experimental results of film thickness in angstroms measured by X-ray photoelectron spectroscopy (XPS) versus plasma process time in seconds for different orderings of film deposition and plasma treatment, in accordance with some embodiments. Data points 402 illustrate thicknesses of an aluminum oxide ($Al_2O_3$, AlO, or the like) film (e.g., a film 310; see above, FIG. 5) formed on a silicon dioxide ($SiO_2$) surface (e.g., a second layer 204) after processes in which a pre-coat film of aluminum oxide (e.g., a pre-coat film 210) is formed and followed by a plasma treatment (e.g., the plasma treatment 300; see above, FIG. 4). In some embodiments, the pre-coat film is formed by an ALD process with 10 cycles. The steps of forming the pre-coat film with an ALD process and performing the plasma treatment may be repeated multiple times, such as 20 times. As shown by data points 402, the thickness of the aluminum oxide film formed after the plasma treatment decreases slowly with increasing plasma process time. This may be due to the pre-coat film blocking diffusion of radicals from the plasma treatment to the $SiO_2$ surface.

Data points 404 illustrate thicknesses of an aluminum oxide film formed on an $SiO_2$ surface (e.g., a second layer 204) after processes in which a plasma treatment is followed by forming a pre-coat film of aluminum oxide (e.g., a pre-coat film 210). As shown by data points 404, the thickness of the aluminum oxide film formed after the plasma treatment decreases significantly with increasing plasma process time in comparison with the processes of the data points 402. This may indicate that the plasma treatment damages the $SiO_2$ surface more when the plasma treatment precedes the formation of the pre-coat film (as in data points 404) instead of following the formation of the pre-coat film (as in data points 402).

Data points 406 illustrate thicknesses of an aluminum oxide film formed on a silicon surface (e.g., a second layer 204; see above, FIG. 5) after processes in which a pre-coat film of aluminum oxide is formed and followed by a plasma treatment, and data points 408 illustrate thicknesses of an aluminum oxide film formed on a silicon surface after processes in which a plasma treatment is followed by forming a pre-coat film of aluminum oxide. As illustrated by data points 406 and 408, results on the silicon surface for either order of the pre-coat film formation and plasma treatment are similar, which may indicate that the plasma treatment reduces formation of the aluminum oxide on the silicon surface effectively whether or not the pre-coat film precedes the plasma treatment. This may be due to the selectivity of the pre-coat film to the $SiO_2$ surface with respect to the silicon surface.

Figure 10:
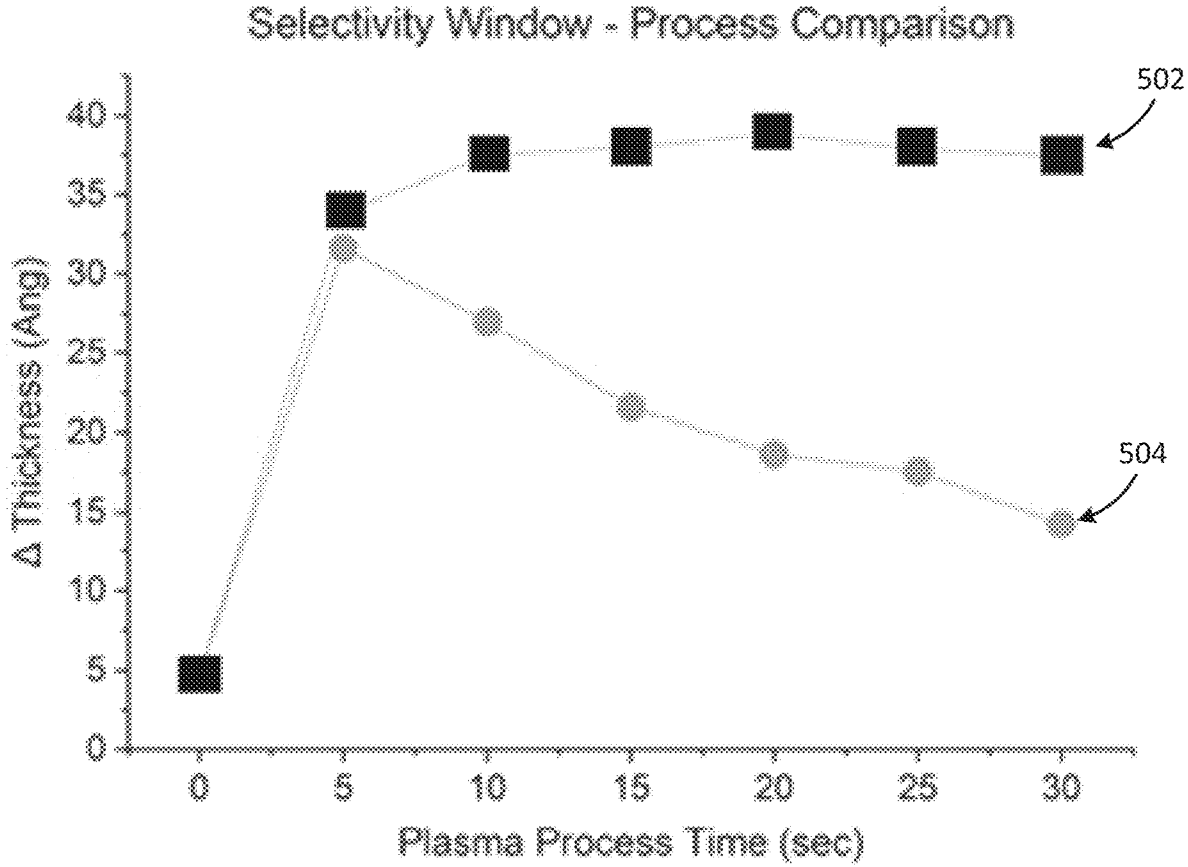

FIG. 10 illustrates another graph of experimental results of film thickness in angstroms measured by X-ray photoelectron spectroscopy (XPS) versus plasma process time in seconds for different orderings of film deposition and plasma treatment, in accordance with some embodiments. Data points 502 illustrate thicknesses of an aluminum oxide ($Al_2O_3$, AlO, or the like) film (e.g., a film 310; see above, FIG. 5) formed on a silicon dioxide ($SiO_2$) surface (e.g., a second layer 204) after processes in which a pre-coat film of aluminum oxide (e.g., a pre-coat film 210) is formed and followed by a plasma treatment (e.g., the plasma treatment 300; see above, FIG. 4). Data points 504 illustrate thicknesses of an aluminum oxide film formed on an $SiO_2$ surface (e.g., a second layer 204) after processes in which a plasma treatment is followed by forming a pre-coat film of aluminum oxide (e.g., a pre-coat film 210). In some embodiments, the pre-coat film is formed by an ALD process with 10 cycles. The comparison of the processes illustrated by data points 502 and 504 may show that the selectivity window for forming the aluminum oxide film on the $SiO_2$ surface is expanded by performing the pre-coat film formation before the plasma treatment.

Figure 11:
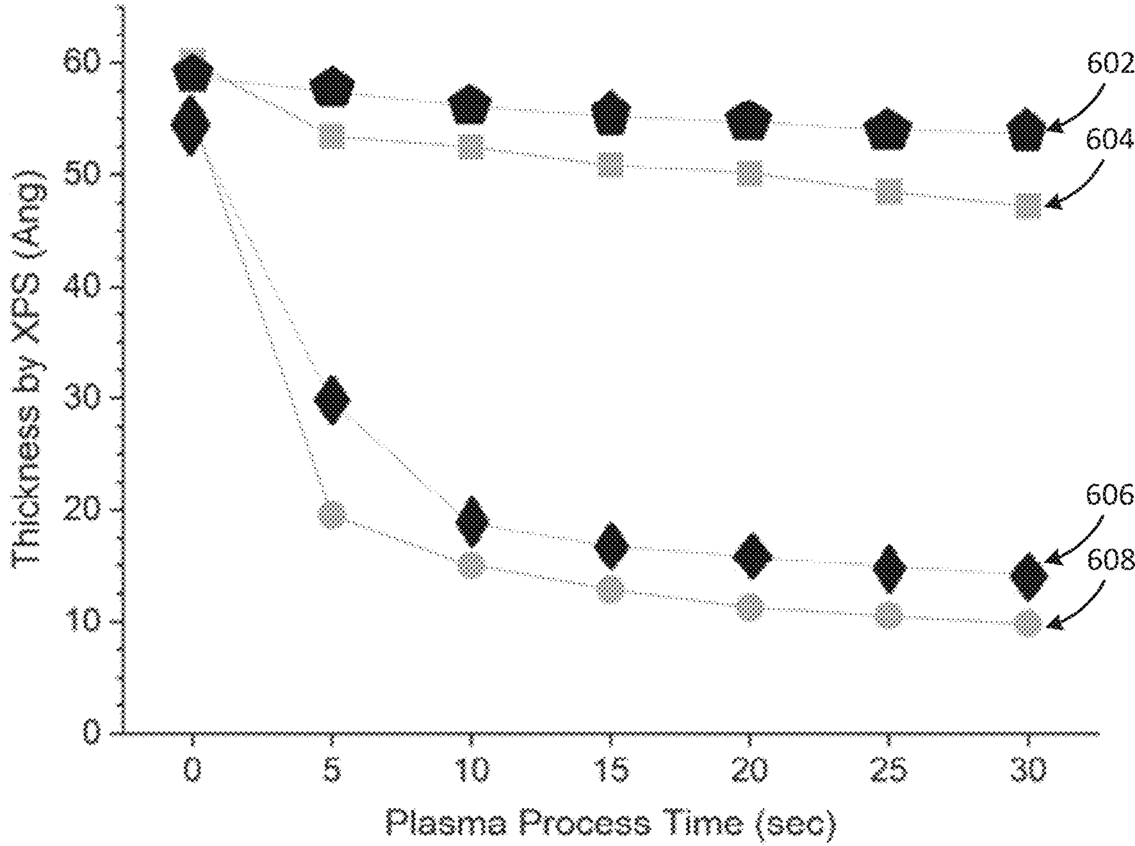

FIG. 11 illustrates another graph of experimental results of film thickness in angstroms measured by X-ray photoelectron spectroscopy (XPS) versus plasma process time in seconds for different orderings of film deposition and plasma treatment, in accordance with some embodiments. Data points 602 illustrate thicknesses of an aluminum oxide film formed on a $SiO_2$ surface after processes in which a pre-coat film of aluminum oxide is formed with 10 cycles of an ALD process and followed by a plasma treatment, similar to data points 402 as described above with respect to FIG. 9. The steps of forming the pre-coat film with an ALD process and performing the plasma treatment may be repeated multiple times, such as 20 times.

Data points 604 illustrate thicknesses of an aluminum oxide film formed on a $SiO_2$ surface after processes in which a pre-coat film of aluminum oxide is formed with 20 cycles of an ALD process, which is then followed by the plasma treatment and additional cycles (e.g., 10 cycles) of forming aluminum oxide film. In some embodiments, the steps of the plasma treatment and the additional cycles of forming aluminum oxide film are repeated multiple times, such as 16 times. Data points 602 and 604 may show that the pre-coat film blocks diffusion of radicals from the plasma treatment to the $SiO_2$ surface, thereby increasing the efficiency of subsequent formation of an aluminum oxide film.

Data points 606 show the processes of data points 604 on a silicon surface rather than an $SiO_2$ surface and data points 608 show the processes of data points 604 on a silicon surface rather than an $SiO_2$ surface. This may indicate that the plasma treatment reduces formation of the aluminum oxide on the silicon surface effectively whether or not the pre-coat film precedes the plasma treatment, although a longer formation of the pre-coat film (such as 20 cycles rather than 10 cycles) may form more aluminum oxide on the silicon surface.

Figure 12:
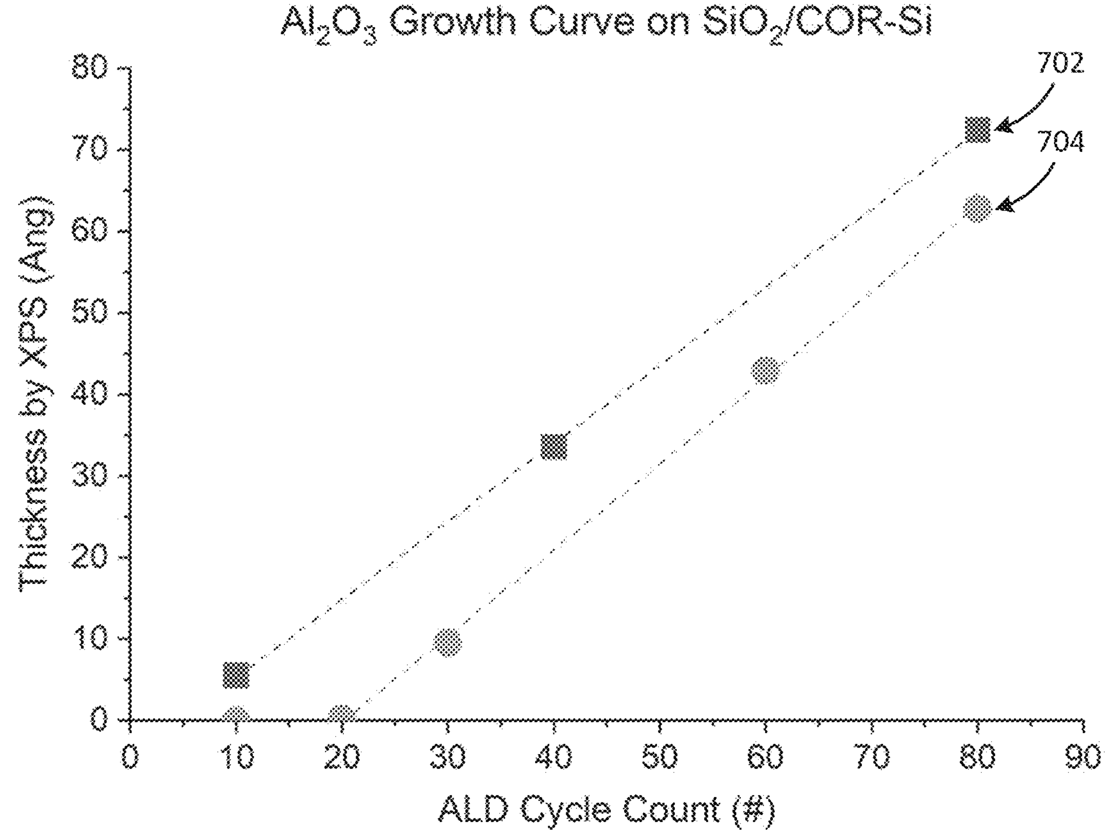

FIG. 12 illustrates a graph of experimental results of aluminum oxide ($Al_2O_3$) film thickness in angstroms measured by X-ray photoelectron spectroscopy (XPS) versus ALD cycle count on $SiO_2$ surfaces and silicon surfaces. Data points 702 illustrate the thickness of an aluminum oxide film formed on a $SiO_2$ surface with increasing numbers of ALD cycles, and data points 704 illustrate the thickness of an aluminum oxide film formed on a silicon surface with increasing numbers of ALD cycles. As illustrated by FIG. 12, the aluminum oxide film thickness increases linearly on the $SiO_2$ surface at about 10 cycles, and the aluminum oxide film thickness increases linearly on the silicon surface starting at about 20 cycles, which may be due to the selectivity of the aluminum oxide formed by the ALD process to the $SiO_2$ surface over the silicon surface. This may indicate that forming an aluminum oxide pre-coat film with 10 to 20 cycles of an ALD process is advantageous to forming the pre-coat film on an $SiO_2$ surface while a silicon surface remains free of aluminum oxide.

Figure 13:
FIG. 13 illustrates a process flow chart diagram of a method for semiconductor processing, in accordance with some embodiments.
Figure 13:
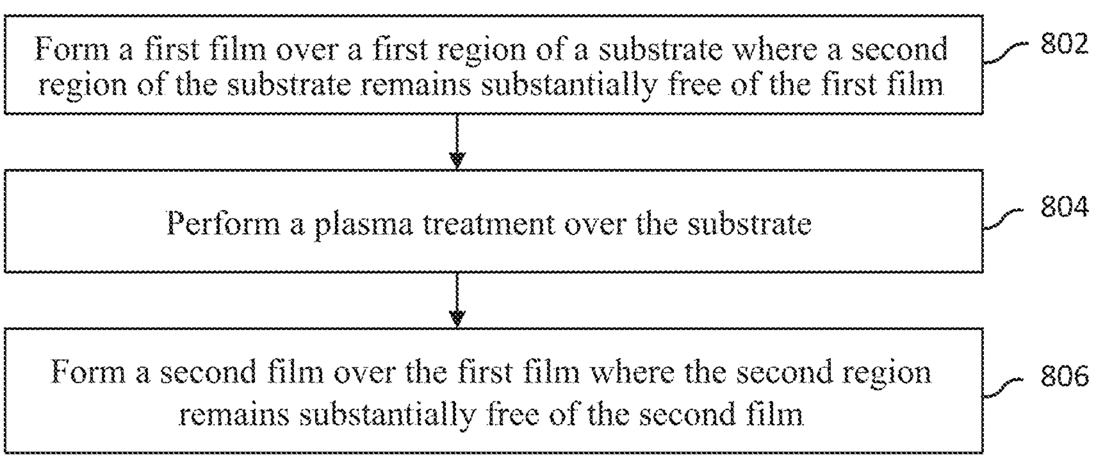

FIG. 13 illustrates a process flow chart diagram of a method 800 for semiconductor processing, in accordance with some embodiments. In step 802, a first film (e.g., the pre-coat film 210) is formed over a first region 200A of a substrate (e.g., a semiconductor structure 200) and a second region 200B of the substrate remains substantially free of the first film, as described above with respect to FIG. 3. The second region 200B is adjacent to the first region 200A.

In step 804, a plasma treatment 300 is performed over the substrate, as described above with respect to FIG. 4. The first film blocks radicals from the plasma treatment 300. In step 806, a second film (e.g., the film 310) is selectively deposited over the first film, as described above with respect to FIG. 5. The second region 200B of the substrate remains substantially free of the second film.

Figure 14:
FIG. 14 illustrates a process flow chart diagram of a method for performing an area selective deposition process, in accordance with some embodiments.
Figure 14:
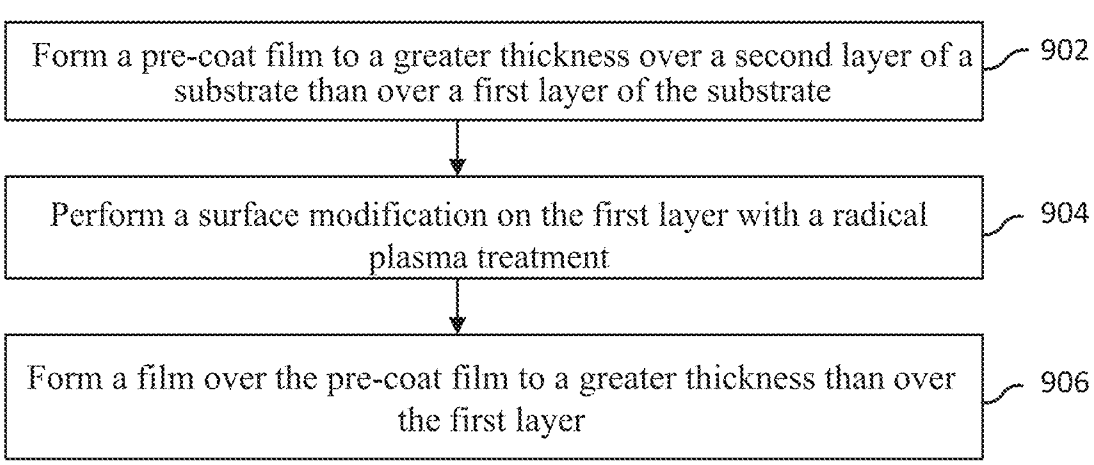

FIG. 14 illustrates a process flow chart diagram of a method 900 for an area selective deposition process, in accordance with some embodiments. In step 902, a pre-coat film 210 is formed over a substrate (e.g., the semiconductor structure 200), as described above with respect to FIG. 3. The substrate comprises a first layer 202 and a second layer 204 adjacent to the first layer 202. The second layer 204 comprises a material different from the first layer 202. The pre-coat film is formed to a greater thickness over the second layer 204 than over the first layer 202.

In step 904, a surface modification is performed on the first layer 202 with a radical plasma treatment (e.g., the plasma treatment 300), as described above with respect to FIG. 4. In step 906, a film 310 is formed over the pre-coat film 210, as described above with respect to FIG. 5. The film 310 is formed to a greater thickness over the pre-coat film 210 than over the first layer 202.

Figure 15:
FIG. 15 illustrates a process flow chart diagram of a method for manufacturing a semiconductor structure, in accordance with some embodiments.
Figure 15:
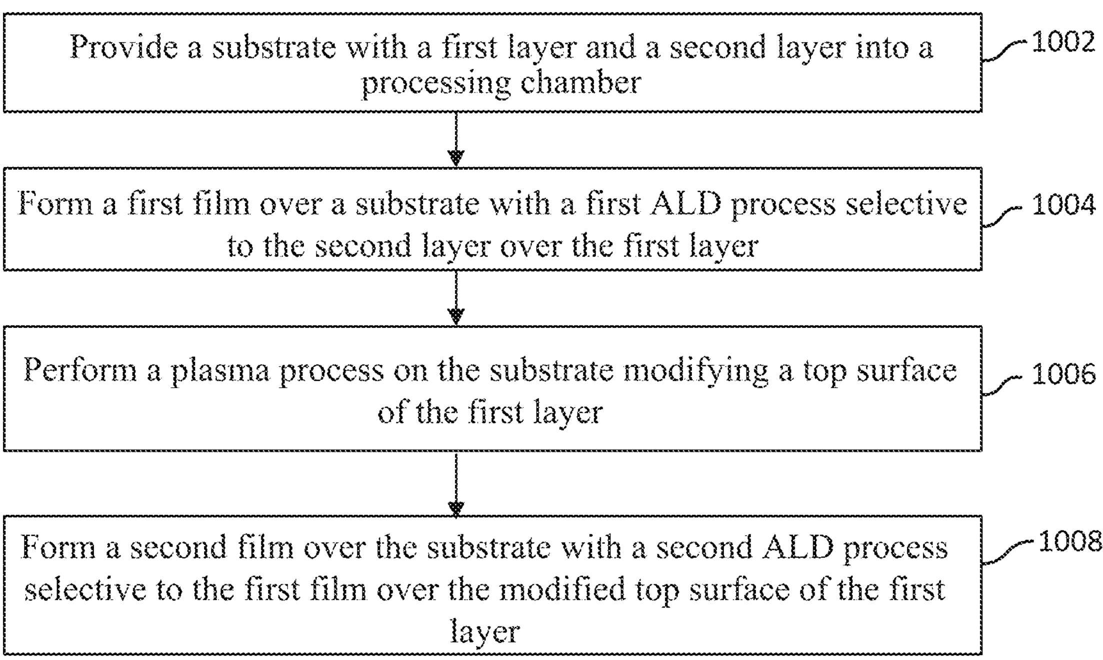

FIG. 15 illustrates a process flow chart diagram of a method 1000 for manufacturing a semiconductor structure, in accordance with some embodiments. In step 1002, a substrate (e.g., a semiconductor structure 200) is provided into a processing chamber (e.g., a plasma processing chamber 106), as described above with respect to FIG. 3. The substrate comprises a first layer 202 and a second layer 204.

In step 1004, a first film (e.g., a pre-coat film 310) is formed over the substrate with a first ALD process, as described above with respect to FIG. 3. The first ALD process is selective to the second layer 204 over the first layer 202.

In step 1006, a plasma process (e.g., the plasma treatment 300) is performed on the substrate, as described above with respect to FIG. 4. The plasma process modifies a top surface of the first layer 202. The first film shields the second layer 204 from radicals 304 of the plasma process.

In step 1008, a second film (e.g., the film 310) is formed over the substrate with a second ALD process, as described above with respect to FIG. 5. The second ALD process is selective to the first film over the modified top surface of the first layer 202.

Example embodiments of the disclosure are summarized here. Other embodiments can also be understood from the entirety of the specification as well as the claims filed herein.

Example 1. A method for semiconductor processing, the method including: forming a first film over a first region of a substrate, a second region of the substrate remaining substantially free of the first film, the second region being adjacent to the first region; performing a plasma treatment over the substrate, the first film blocking radicals from the first region during the plasma treatment; and selectively depositing a second film over the first film, the second region of the substrate remaining substantially free of the second film.

Example 2. The method of example 1, where the first region of the substrate includes a first material and the second region of the substrate includes a second material, the second material being different from the first material.

Example 3. The method of example 2, where the first material is a semiconductor and the second material is a dielectric.

Example 4. The method of one of examples 2 or 3, where the first material includes crystalline silicon.

Example 5. The method of one of examples 2 to 4, where the second material includes silicon oxide.

Example 6. The method of one of examples 2 to 5, where the second material includes silicon nitride.

Example 7. The method of one of examples 2 to 6, where the second material includes organosilicate glass.

Example 8. The method of example 2, where the first material is a metal and the second material is a dielectric.

Example 9. The method of example 2, where the first material is a first metal and the second material is a second metal.

Example 10. The method of example 2, where the first material is a first semiconductor and the second material is a second semiconductor.

Example 11. A method for an area selective deposition process, the method including: forming a pre-coat film over a substrate, the substrate including a first layer and a second layer adjacent to the first layer, the second layer including a material different from the first layer, where the pre-coat film is formed to a greater thickness over the second layer than over the first layer; performing a surface modification on the first layer with a radical plasma treatment; and forming a film over the pre-coat film, where the film is formed to a greater thickness over the pre-coat film than over the first layer.

Example 12. The method of example 11, where the pre-coat film includes aluminum oxide.

Example 13. The method of one of examples 11 or 12, where the pre-coat film includes hafnium oxide or zirconium oxide.

Example 14. The method of one of examples 11 to 13, where the radical plasma treatment includes H* radical species.

Example 15. The method of one of examples 11 to 14, where the radical plasma treatment includes O* radical species.

Example 16. The method of one of examples 11 to 15, where the radical plasma treatment includes N* radical species.

Example 17. A method for manufacturing a semiconductor structure, the method including: providing a substrate into a processing chamber, the substrate including a first layer and a second layer; forming a first film over the substrate with a first ALD process, the first ALD process being selective to the second layer over the first layer; performing a plasma process on the substrate, the plasma process modifying a top surface of the first layer, the first film shielding the second layer from radicals of the plasma process; and forming a second film over the substrate with a second ALD process, the second ALD process being selective to the first film over the modified top surface of the first layer.

Example 18. The method of example 17, where the plasma process is performed with microwave plasma.

Example 19. The method of one of examples 17 or 18, where the plasma process is performed with capacitively coupled plasma.

Example 20. The method of one of examples 17 to 19, where the plasma process is performed with inductively coupled plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for semiconductor processing, the method comprising:

forming a first film over a first region of a substrate, a second region of the substrate remaining substantially free of the first film, the second region being adjacent to the first region;

performing a plasma treatment over the substrate, the first film blocking radicals from the first region during the plasma treatment; and after performing the plasma treatment, selectively depositing a second film over the first film, the second region of the substrate remaining substantially free of the second film.

2. The method of claim 1, wherein the first region of the substrate comprises a first material and the second region of the substrate comprises a second material, the second material being different from the first material.

3. The method of claim 2, wherein the first material is a semiconductor and the second material is a dielectric.

4. The method of claim 3, wherein the first material comprises crystalline silicon.

5. The method of claim 3, wherein the second material comprises silicon oxide.

6. The method of claim 3, wherein the second material comprises silicon nitride.

7. The method of claim 3, wherein the second material comprises organosilicate glass.

8. The method of claim 2, wherein the first material is a metal and the second material is a dielectric.

9. The method of claim 2, wherein the first material is a first metal and the second material is a second metal.

10. The method of claim 2, wherein the first material is a first semiconductor and the second material is a second semiconductor.

11. A method for an area selective deposition process, the method comprising:

forming a pre-coat film over a substrate, the substrate comprising a first layer and a second layer adjacent to the first layer, the second layer comprising a material different from the first layer, wherein the pre-coat film is formed to a greater thickness over the second layer than over the first layer;

performing a surface modification on the first layer with a radical plasma treatment; and after performing the surface modification, forming a film over the pre-coat film, wherein the film is formed to a greater thickness over the pre-coat film than over the first layer.

12. The method of claim 11, wherein the pre-coat film comprises aluminum oxide.

13. The method of claim 11, wherein the pre-coat film comprises hafnium oxide or zirconium oxide.

14. The method of claim 11, wherein the radical plasma treatment comprises H* radical species.

15. The method of claim 11, wherein the radical plasma treatment comprises O* radical species.

16. The method of claim 11, wherein the radical plasma treatment comprises N* radical species.

17. A method for manufacturing a semiconductor structure, the method comprising:

providing a substrate into a processing chamber, the substrate comprising a first layer and a second layer;

forming a first film over the substrate with a first ALD process, the first ALD process being selective to the second layer over the first layer;

performing a plasma process on the substrate, the plasma process modifying a top surface of the first layer, the first film shielding the second layer from radicals of the plasma process; and after performing the plasma process on the substrate, forming a second film over the substrate with a second ALD process, the second ALD process being selective to the first film over the modified top surface of the first layer.

18. The method of claim 17, wherein the plasma process is performed with microwave plasma.

19. The method of claim 17, wherein the plasma process is performed with capacitively coupled plasma.

20. The method of claim 17, wherein the plasma process is performed with inductively coupled plasma.

* * * * *